(12) United States Patent
Hshieh et al.

(10) Patent No.: US 6,548,860 B1
(45) Date of Patent: Apr. 15, 2003

(54) DMOS TRANSISTOR STRUCTURE HAVING IMPROVED PERFORMANCE

(75) Inventors: Fwu-Iuan Hshieh, Saratoga, CA (US); Koon Chong So, Fremont, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/515,335

(22) Filed: Feb. 29, 2000

(51) Int. Cl.⁷ .......................... H01L 29/76; H01L 29/94
(52) U.S. Cl. ................ 257/328; 257/334; 257/335; 257/337; 438/212; 438/330
(58) Field of Search ................ 257/335, 328, 257/329–331, 337–341, 334; 438/212, 330, 259, 270, 271, 589

(56) References Cited

U.S. PATENT DOCUMENTS

| | | | |
|---|---|---|---|
| 5,043,779 A | 8/1991 | Nishimura | 357/23.4 |
| 5,072,266 A | 12/1991 | Bulucea et al. | 357/23.4 |
| 5,688,725 A * | 11/1997 | Darwish et al. | 437/270 |
| 5,763,915 A | 6/1998 | Hshieh et al. | 257/330 |
| 5,986,304 A | 11/1999 | Hshieh et al. | 257/330 |
| 5,998,266 A | 12/1999 | So | 438/270 |
| 5,998,837 A * | 12/1999 | Williams | 257/341 |

FOREIGN PATENT DOCUMENTS

JP 58100460 6/1983 ........... H01L/29/78

* cited by examiner

Primary Examiner—Tom Thomas
Assistant Examiner—Donghee Kang
(74) Attorney, Agent, or Firm—Mayer Fortkort & Williams, PC; Stuart H. Mayer, Esq.; Karin L. Williams, Esq.

(57) ABSTRACT

A trench DMOS transistor structure is provided that includes at least three individual trench DMOS transistor cells formed on a substrate of a first conductivity type. The plurality of individual DMOS transistor cells is dividable into peripheral transistor cells and interior transistor cells. Each of the individual transistor cells includes a body region located on the substrate, which has a second conductivity type. At least one trench extends through the body region and the substrate. An insulating layer lines the trench. A conductive electrode is located in the trench, which overlies the insulating layer. Interior transistor cells, but not the peripheral transistor cells, each further include a source region of the first conductivity type in the body region adjacent to the trench.

22 Claims, 6 Drawing Sheets

DMOS TRANSISTOR STRUCTURE HAVING IMPROVED PERFORMANCE

FIELD OF THE INVENTION

This invention relates to current switching DMOS transistors having a gate formed in a trench and in particular to a trench DMOS transistor having a lower resistance when the device is turned on.

BACKGROUND OF THE INVENTION

Power DMOS transistors are widely used in numerous applications, including automotive electronics, disk drives and power supplies. Generally, these devices function as switches, and they are used to connect a power supply to a load. It is important that the resistance of the device be as low as possible when the switch is closed. Otherwise, power is wasted and excessive heat may be generated.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate.

Such a device is illustrated in FIG. 1, which is a cross-sectional view of a single cell of a DMOS transistor 100, and in FIG. 2, which is a perspective cross-sectional view of the cell. Gates 102 and 104 are formed in trenches and surrounded by gate oxide layers 106 and 108, respectively. The trenched gate is often formed in a grid pattern, the grid representing a single interconnected gate, but a trench gate may also be formed as a series of distinct parallel stripes.

DMOS transistor 100 is a double-diffused device that is formed in an N-epitaxial layer 111. An N+ source region 112 is formed at the surface of epitaxial layer 111, as is a P+ contact region 114. A P-body 116 is located below N+ source region 112 and P+ contact region 114. A metal source contact 118 makes contact with the N+ source region 112 and shorts the N+ source region 112 to the P+ contact region 114 and P region 116.

The N-epitaxial layer 111 is formed on an N+ substrate 120, and a drain contact (not shown) is located at the bottom of the N+ substrate 120. The contacts 121 for the gates 102 and 104 are shown in FIG. 2, which are made by extending the conductive gate material outside of the trench and forming a metal contact at a location remote from the individual cells. FIG. 3 also shows the gate metal contacts 121 forming the connection to gates 102 and 104. The gate is typically made of polysilicon doped with phosphorus or boron. It should be noted that when a series of transistor cells are formed, gate contacts 121 only extend from those cells on the periphery of the structure and not from interior cells.

A region 110 of N-epitaxial layer 111 between the N+ substrate 120 and the P+ body 116 is generally more lightly doped with N-type impurities than is N+ substrate 120. This increases the ability of DMOS transistor 100 to withstand high voltages. Region 110 is sometimes referred to as a "lightly doped" or "drift" region ("drift" referring to the movement of carriers in an electric field). Drift region 110 and N+ substrate 120 constitute the drain of DMOS transistor 100.

DMOS transistor 100 is an N-channel transistor. When a positive voltage is applied to gate 102, a channel region within P-body 116 adjacent the gate oxide 106 becomes inverted and, provided there is a voltage difference between the N+ source region 112 and the N+ substrate 120, an electron current will flow from the source region through the channel region into the drift region 110. In drift region 110, some of the electron current spreads diagonally at an angle until it hits the N+ substrate 120, and then it flows vertically to the drain. Other portions of the current flow straight down through the drift region 110, and some of the current flows underneath the gate 102 and then downward through the drift region 110.

The gates 102 and 104 are doped with;a conductive material. Since DMOS transistor 100 is an N-channel device, gates 102 and 104 could be polysilicon doped with phosphorus. Gates 102 and 104 are insulated from the remainder of DMOS transistor 100 by the gate oxide layers 106 and 108, respectively. The thickness of gate oxide layers 106 and 108 is chosen to set the threshold voltage of DMOS transistor 100 and may also influence the breakdown voltage of DMOS transistor 100.

In DMOS transistor 100 shown in FIGS. 1–3, P+ contact region 114 extends downward below the bottom of the trench to form a deep-heavily doped P body 116 at the center of the cell. In other known DMOS transistors (not shown), the P+ contact region 114 is quite shallow and does not extend below the level of the trench. That is, P+ body 116 is eliminated in these devices. A shallow p+ contact region helps ensure that P-type dopant does not get into the channel region, where it would tend to increase the threshold voltage of the device and cause the turn-on characteristics of the device to vary from one run to another depending on the alignment of the P+ contact region 114. However, with a shallow P+ contact region 114 that eliminates P+ body 116, the device can withstand only relatively low voltages (e.g. 10 volts) when it is turned off. This is because the depletion spreading around the junction between P+ contact region 114 and drift region 110 does not adequately protect the corners of the trench (e.g., corner 122 shown in FIG. 1). As a result, avalanche breakdown may occur in the vicinity of the trench, leading to a high generation rate of carriers which can charge or degrade the gate oxide 106 or even, in an extreme case, cause a rupture in the gate oxide 106. Thus such a known DMOS transistor is at best a low voltage device.

As previously mentioned, however, in the known DMOS transistor 100 shown in FIGS. 1–3, the breakdown voltage is increased by extending the P+ contact region 114 downward below the bottom of the trench to form a deep, heavily-doped P body region 116 at the center of the cell. While this provides additional shielding at corner 122, the primary advantage is that carrier generation occurs primarily at the bottom tip 302 of the P+ body 116. This occurs because the electric field is strengthened beneath the tip 302, thereby causing carriers to be generated at that point or along the curvature of the junction rather than adjacent the gate oxide 106. This reduces the stress on gate oxide 106 and improves the reliability of DMOS transistor 100 under high voltage conditions, even though it may reduce the actual junction breakdown of the device. Additional details concerning the downwardly extending P contact regions may be found, for example, in U.S. Pat. Nos. 5,072,266 and 5,688,725.

The deep P+ body 116 in DMOS transistor 100, while greatly reducing the adverse consequences of breakdown, also has some unfavorable effects. First, an upward limit on cell density is created, because with increasing cell density P ions may be introduced into the channel region. As described above, this tends to increase the threshold voltage of the DMOS transistor. Second, the presence of a deep P+ contact body 116 tends to pinch the electron current as it leaves the channel and enters the drift region 110. In those known transistors that do not include a deep P+ body 116, the electron current spreads out when it reaches the drift region 110. This current spreading increases the average current per unit area in the drift region 110 and therefore reduces the on-resistance of the DMOS transistor. The presence of a deep P+ body 116 limits this current spreading and increases the on-resistance consistent with high cell densities.

What is needed, therefore, is a DMOS transistor that combines the breakdown advantages of a deep P+ body with a low on-resistance.

SUMMARY OF THE INVENTION

In accordance with the present invention, a trench DMOS transistor structure is provided that includes at least three individual trench DMOS transistor cells formed on a substrate of a first conductivity type. The plurality of individual DMOS transistor cells is dividable into peripheral transistor cells and interior transistor cells. Each of the individual transistor cells includes a body region located on the substrate, which has a second conductivity type. At least one trench extends through the body region and the substrate. An insulating layer lines the trench. A conductive electrode is located in the trench, which overlies the insulating layer. Interior transistor cells, but not the peripheral transistor cells, each further include a source region of the first conductivity type in the body region adjacent to the trench. Accordingly, the peripheral transistor cells are inactive while the interior transistor cells are active transition. As a result, a low threshold voltage is obtained while avoiding the need for a deep p+ contact region.

In accordance with one aspect of the invention, the body regions are substantially flat across the width of the transistor cells in which they are respectively located. Alternatively, the body regions may have a bimodal distribution across the width of the transistor cells in which they are respectively located.

In accordance with another aspect of the invention, the trench extends to a depth below the depth of the body region.

In accordance with yet another aspect of the invention, the peripheral transistor cells are more lightly doped than the body regions of the interior transistor cells.

In accordance with another aspect of the invention, a trench DMOS transistor structure is provided that includes at least three individual trench DMOS transistor cells formed on a substrate of a first conductivity type. The plurality of individual DMOS transistor cells is dividable into peripheral transistor cells and interior transistor cells. Each of the individual transistor cells includes a body region located on the substrate, which has a second conductivity type. The body regions have a bimodal distribution across the width of the transistor cells in which they are respectively located. At least one trench extends through the body region and the substrate. An insulating layer lines the trench. A conductive electrode located in the trench overlies the insulating layer. The interior transistor cells each further include a source region of the first conductivity type. The source region is located in the body region adjacent to the trench.

DETAILED DESCRIPTION

Figure 1:
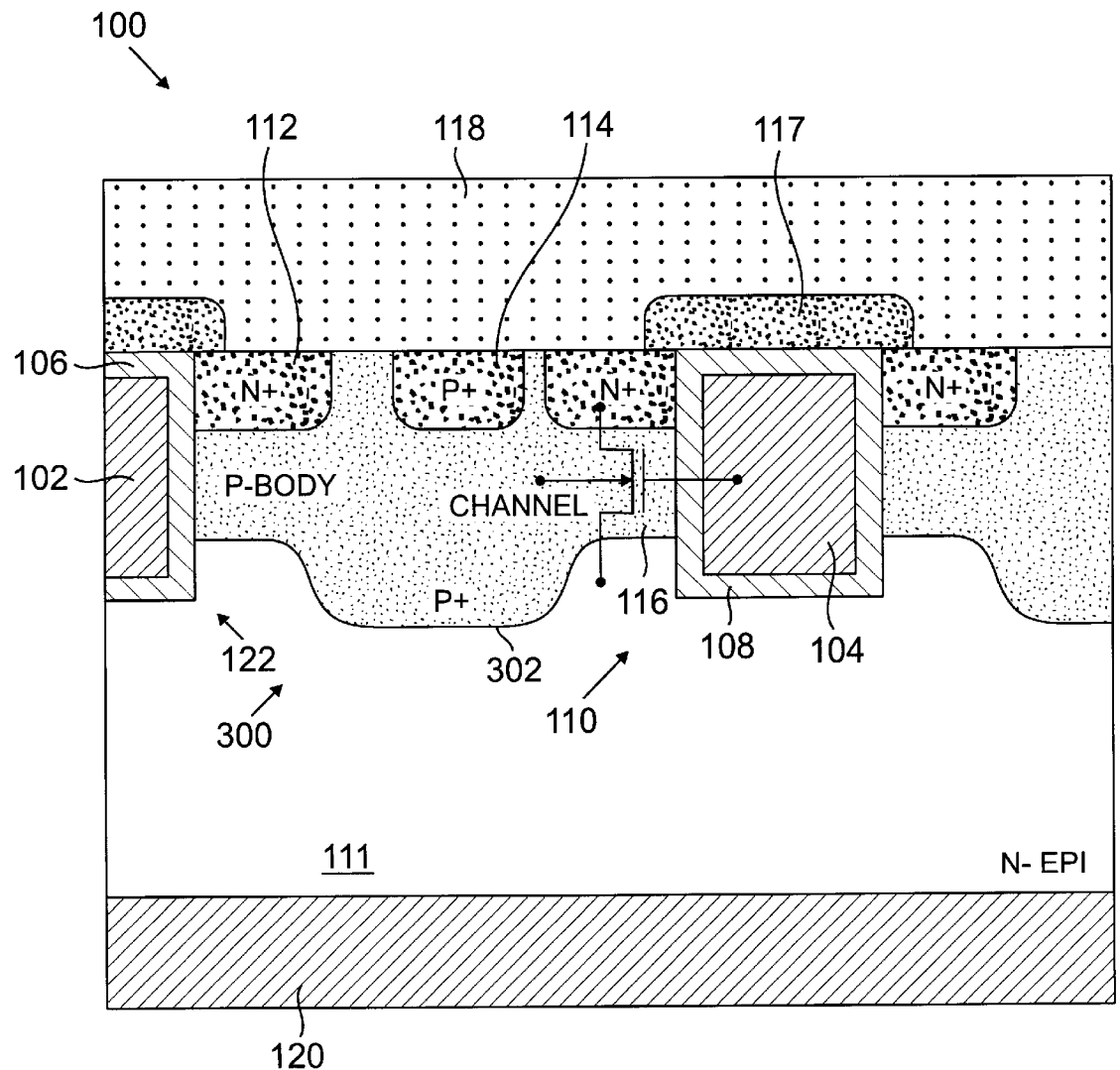
FIGS. 1 and 2 illustrate cross-sectional and perspective views, respectively, of a cell of a conventional vertical trench N-channel DMOS transistor having a relatively deep central P+ contact region.
Figure 2:
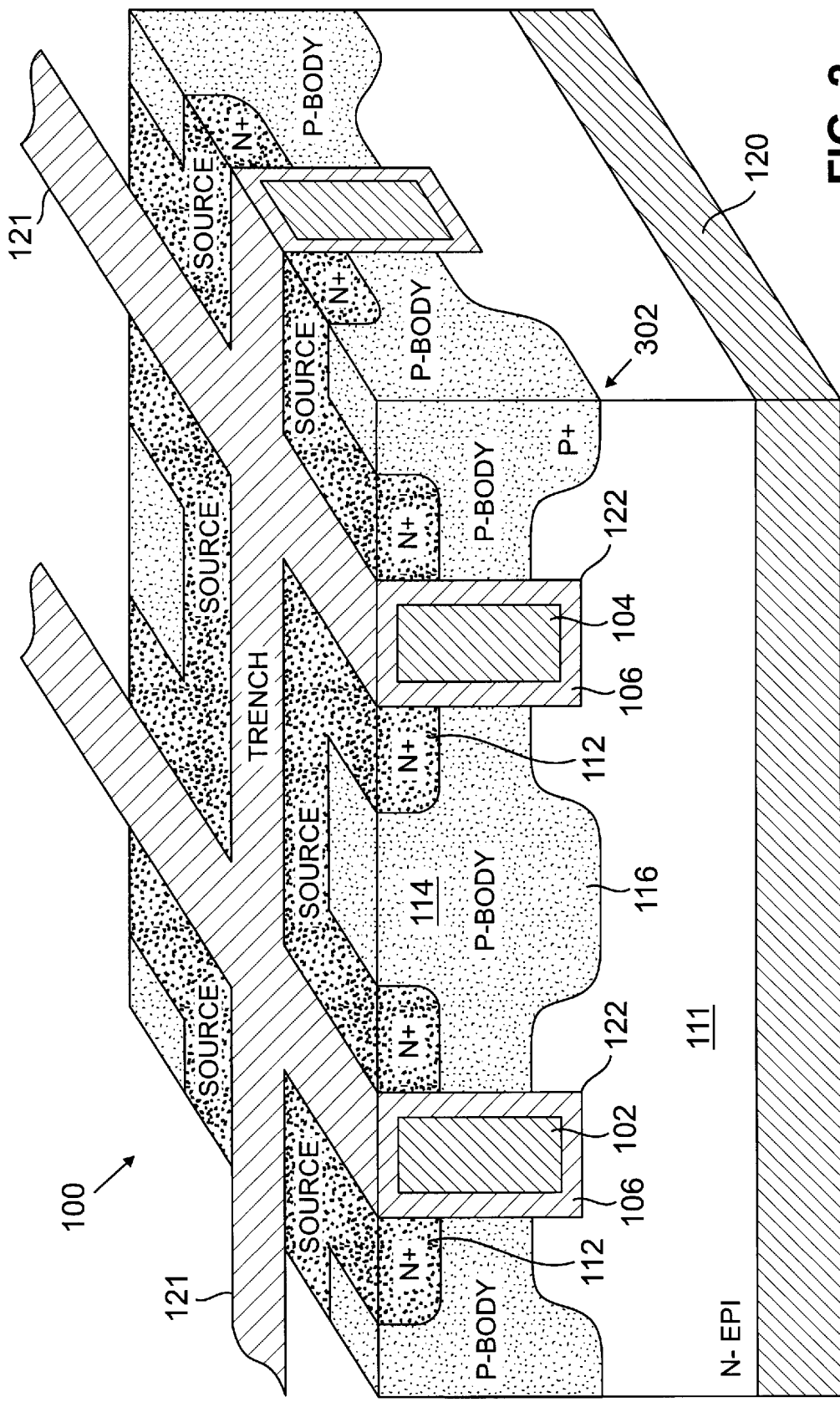
Figure 3:
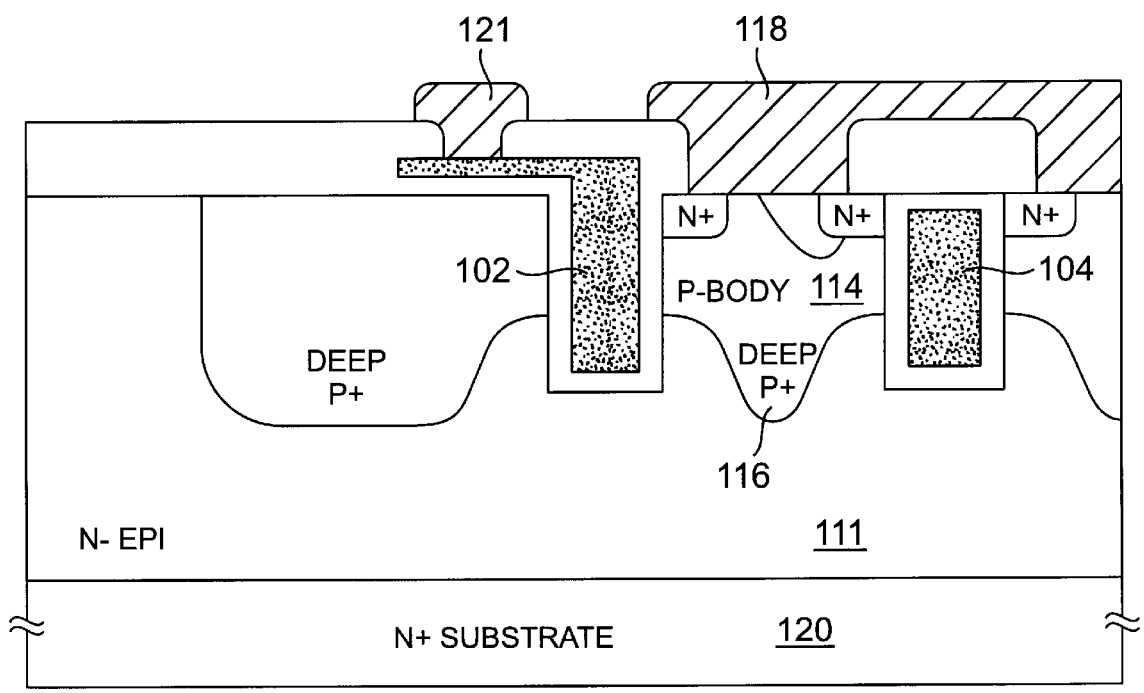
FIG. 3 illustrates another cross-sectional view of a conventional N-channel DMOS transistor having a relatively deep central P+ contact region.
Figure 4:
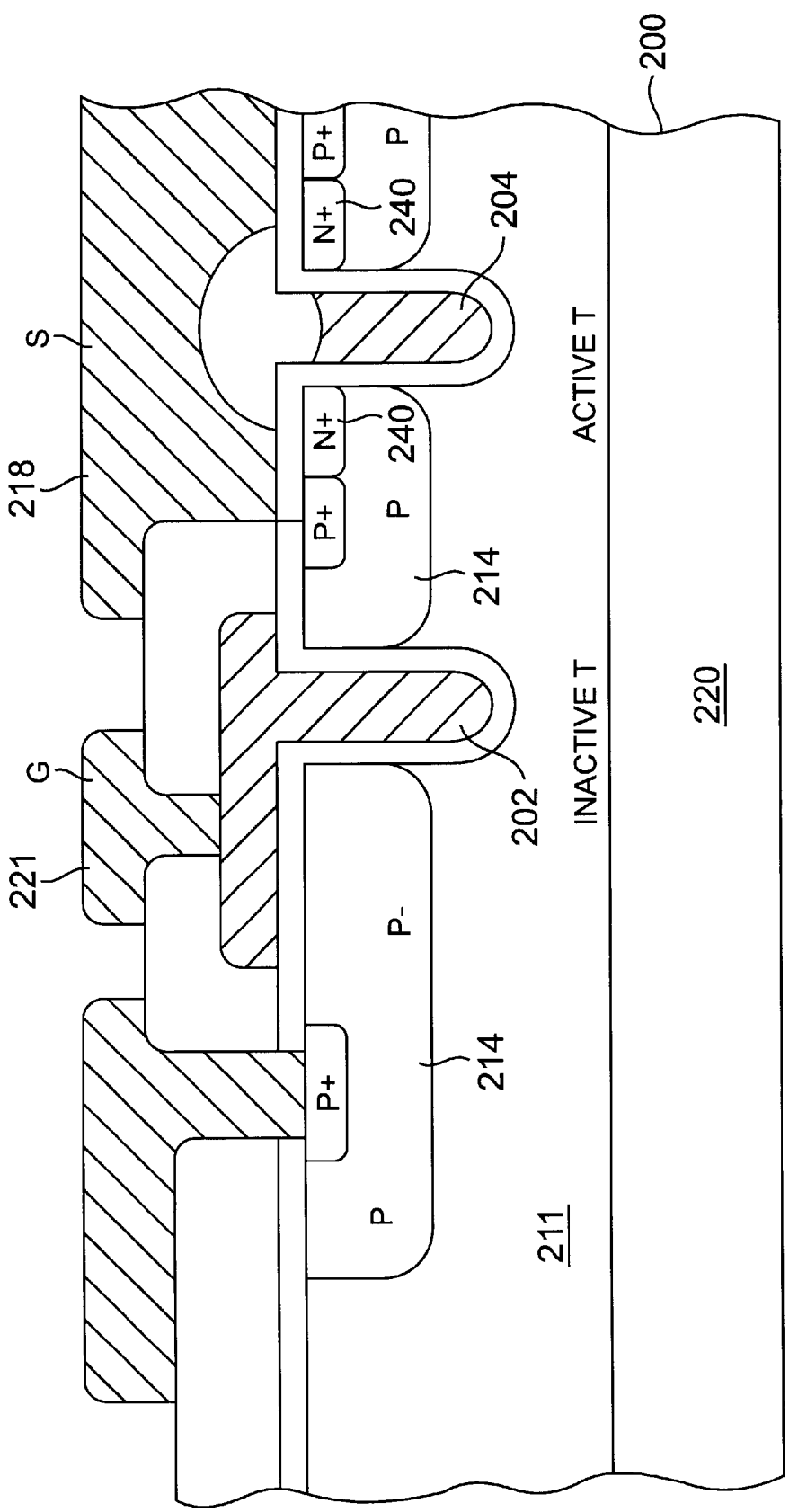
FIG. 4 illustrates a cross-sectional view of a peripheral and interior transistor cell constructed in accordance with the present invention.
Figure 5:
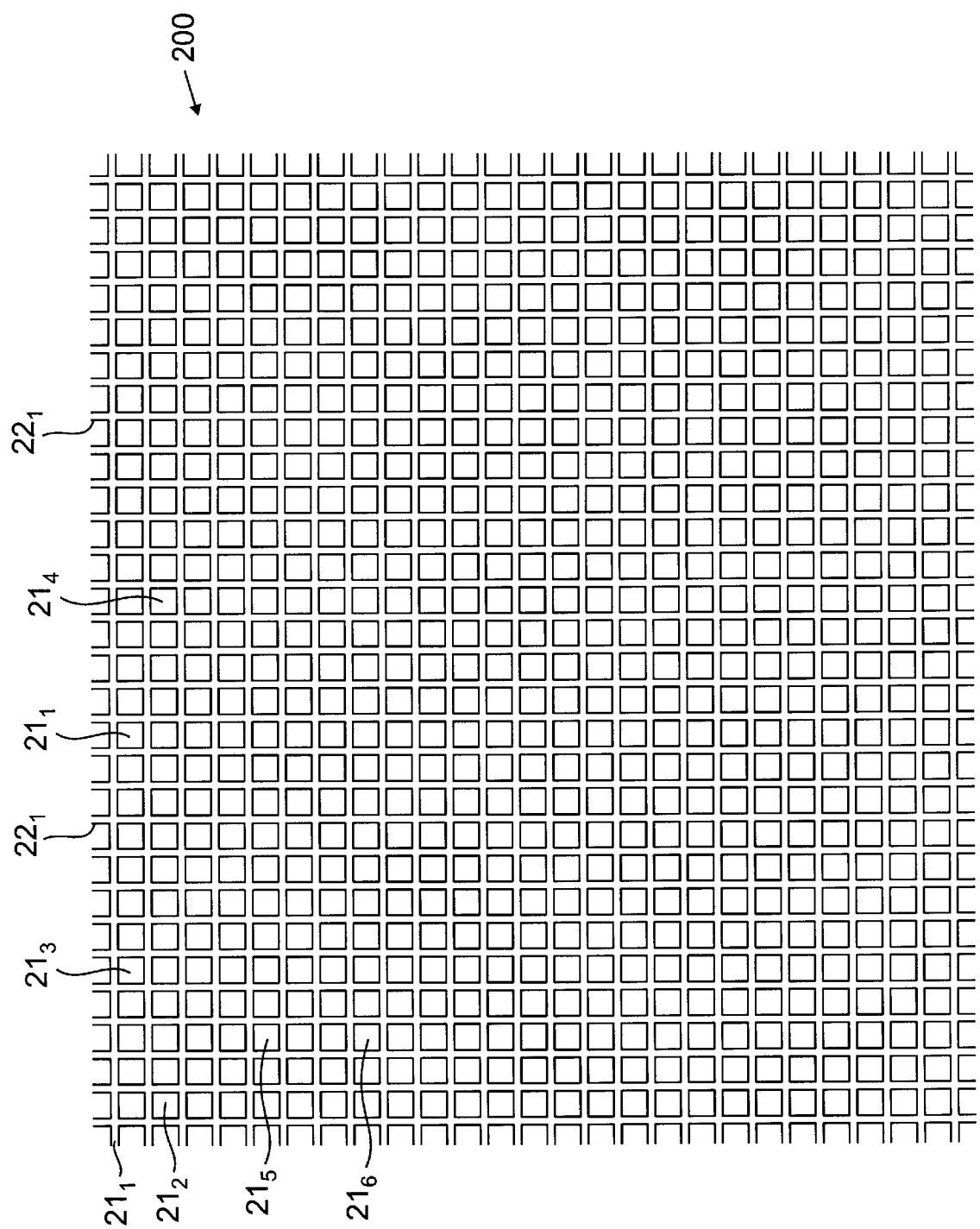
FIG. 5 illustrates a plan view of the transistor structure constructed in accordance with the present invention.

FIG. 4 illustrates a cross-sectional view and FIG. 5 shows a plan view of one embodiment of a trench DMOS structure 200 in which the individual cells 21 are rectangular in shape in a horizontal cross-section. The structure includes, in this embodiment, an n+ substrate 220 on which is grown a lightly n-doped epitaxial layer 211. Within doped epitaxial layer 211, contact and body region 214 of opposite conductivity are provided. An n-doped epitaxial layer 240 that overlies a part of the body region 214 serves as the source. Rectangularly, shaped trenches 202 and 204 are provided in the epitaxial layers, which is open at the upper surface of the structure and defines the perimeter of the transistor cell. A gate oxide layer 230 lines the sidewalls of the trenches 202 and 204. The trenches 202 and 204 are filled with polysilicon, i.e., polycrystalline silicon. A drain electrode is connected to the back surface of the semiconductor substrate 220, a source electrode 218 is connected to the two source regions 240 and the contact region 214, and a gate electrode 221 is connected to the polysilicon that fills the trench 202. The polysilicon lining the trenches is continuously connected over the surface of structure 200. In addition, as shown in FIGS. 4 and 5, polysilicon contacts 221 extend beyond the surface of structure 200 to serve as interconnects to peripheral transistor cells such as cells $21_1$, $21_2$ and $21_3$. Interior transistor cells such as cells $21_4$, $21_5$ and $21_6$ are interconnected to one another and to the peripheral cells by the trenches themselves. In FIG. 4, trench 202 is associated with a peripheral cell while trench 204 is associated with an interior cell.

It should be noted that the transistor cells 21 need not have a rectangular shape for basic transistor operation, but more generally may have any polygonal shape. However, a regular rectangular shape and a regular hexagonal shape are the most convenient for layout purposes. Alternatively, rather than having a closed-cell geometry as depicted in the figures, the transistor cell may have an open or stripe geometry.

As previously mentioned, the deep p+ contact region employed in prior art DMOS transistors causes an increase in the threshold voltage as the cell density increases. The deep central p+ region also causes an increase in the on-resistance of the device. However, without the deep p+ contact region, the breakdown voltage of the device would be unacceptably low for many applications.

In accordance with the present invention, a low threshold voltage is obtained while avoiding the need for a deep p+ contact region by providing peripheral transistor cells in which the transistors are inactive and interior transistor cells in which the transistors are active. As seen in FIG. 4, trench 202 is associated with a peripheral transistor cell while trench 204 is associated with an interior transistor cell. The inactive peripheral transistor cells are distinguished from the active interior transistor cells in that the source regions of the inactive transistors have been eliminated. For example, as seen in FIG. 4. the peripheral transistor cell associated with trench 202 does not have any source regions. Moreover, the p+ contact region 214 associated with a peripheral transistor cell is more lightly doped than the p+ contact regions associated with interior cells. As a result of the lighter doping, breakdown will not occur in these peripheral cells. Rather, this arrangement ensures that avalanche breakdown occurs within interior cells. Consequently, the inventive DMOS transistor array may be used at higher voltages. Moreover, since the need for a deep p+ contact region is avoided, undesirable increases in the threshold voltage and the on-resistance are also avoided.

Figure 6:
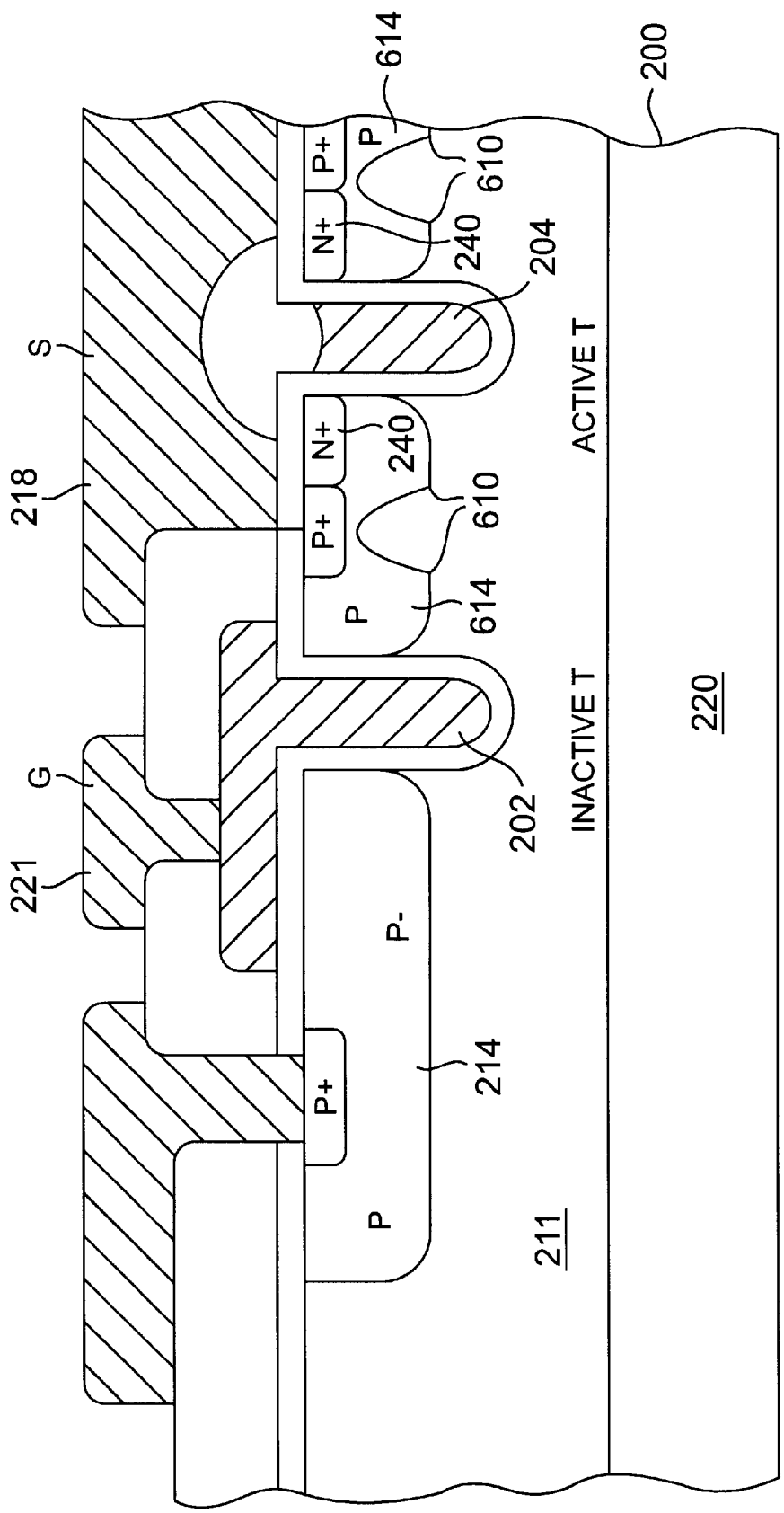
FIG. 6 illustrates an alternative embodiment of the present invention.

FIG. 6 shows one particular embodiment of the invention in which the P+ contact regions 614 have a bimodal distribution rather than a substantially flat distribution along the width of the transistor cells. In this embodiment of the invention avalanche breakdown generally occurs in the vicinity of points labeled 610.

Although various embodiments are specifically illustrated and described herein, it will be appreciated that modifications and variations of the present invention are covered by the above teachings and are within the purview of the appended claims without departing from the spirit and intended scope of the invention. For example, the present invention is equally applicable to a trench DMOS in which the conductivities of the various semiconductor regions are reversed from those described herein.

What is claimed is:

1. A trench DMOS transistor structure that includes at least three individual trench DMOS transistor cells formed on a substrate of a first conductivity type, said plurality of individual DMOS transistor cells being dividable into peripheral transistor cells and interior transistor cells, each of said individual transistor cells comprising:

body region on the substrate, said body region having a second conductivity type;

at least one trench extending through the body region and the substrate;

an insulating layer that lines the trench;

a conductive electrode in the trench overlying the insulating layer; and wherein said interior transistor cells but not said peripheral transistor cells each further include a source region of the first conductivity type in the body region adjacent to the trench, and further wherein the body regions of said peripheral transistor cells are more lightly doped than the body regions of said interior transistor cells.

2. The transitor of claim 1 wherein said body regions are substantially flat across the width of the transitor cells in which they are respectively located.

3. The transistor of claim 1 wherein said at least one trench extends to a depth below the depth of the body region.

4. The transistor of claim 3 further comprising a plurality of polysilicon contacts respectively connected to each of the conductive electrodes of the peripheral transistor cells.

5. The transistor of claim 1 wherein said body regions each have a bimodal distribution across the width of the transistor cells in which they are respectively located.

6. The transistor of claim 5 further comprising a plurality of polysilicon contacts respectively connected to each of the conductive electrodes of the peripheral transistor cells.

7. The transistor structure of claim 1 further comprising a drain electrode disposed on a surface of the substrate opposing the body region.

8. The transistor structure of claim 1 wherein said insulating layer is an oxide layer.

9. The transistor structure of claim 1 wherein said conductive electrode includes polysilicon.

10. The transistor of claim 1 wherein at least one of said trench DMOS transistor cells has a closed cell geometry.

11. The transistor of claim 10 when said closed cell geometry is rectangular.

12. The transistor of claim 1 wherein at least one of said trench DMOS transistor cells has an open cell geometry.

13. The transistor of claim 1 further comprising a plurality of polysilicon contacts respectively connected to each of the conductive electrodes of the peripheral transistor cells.

14. A trench DMOS transistor structure that includes at least three individual trench DMOS transistor cells formed on a substrate of a first conductivity type, said plurality of individual DMOS transistor cells being dividable into peripheral transistor cells and interior transistor cells, each of said individual transistor cells comprising:

body region on the substrate, said body region having a second conductivity type, wherein said body region has a bimodal distribution across the width of the transistor cells in which they are respectively located;

at least one trench extending through the body region and the substrate;

an insulating layer that lines the trench;

a conductive electrode in the trench overlying the insulating layer; and wherein at least said interior transistor cells each further include a source region of the first conductivity type in the body region adjacent to the trench, and wherein said at least one trench extends to a depth below the depth of said body region, and further wherein the body regions of said peripheral transistor cells are more lightly doped than the body regions of said interior transistor cells.

15. The transistor structure of claim 14 further comprising a drain electrode disposed on a surface of the substrate opposing the body region.

16. The transistor stricture of claim 14 wherein said insulating layer is an oxide layer.

17. The transistor structure of claim 14 wherein said conductor electrode includes polysilicon.

18. The transistor of claim 14 wherein at least one of said trench DMOS transistor cells has a closed cell geometry.

19. The transistor of claim 18 when said closed cell geometry is rectangular.

20. The transistor of claim 14 wherein at least one of said trench DMOS transistor cells has an open cell geometry.

21. The transistor of claim 14 further comprising a plurality of polysilicon contacts respectively connected to each of the conductive electrodes of the peripheral transistor cells.

22. The transistor of claim 14 further comprising a plurality of polysilicon contacts respectively connected to each of the conductive electrodes of the peripheral transistor cells.

\* \* \* \* \*

UNITED STATES PATENT AND TRADEMARK OFFICE
CERTIFICATE OF CORRECTION

PATENT NO.   : 6,548,860 B1
DATED        : April 15, 2003
INVENTOR(S)  : Fwu-Iuan Hshieh et al.

It is certified that error appears in the above-identified patent and that said Letters Patent is hereby corrected as shown below:

Column 2,
Line 14, after "doped", change "with;a" to -- with a --.

Column 5,
Line 36, add first word -- a --.
Line 50, after "The", change "transitor" to -- transistor --.

Column 6,
Line 23, add first word -- a --.
Line 43, after "transistor", change "stricture" to -- structure --.
Line 46, at first word, change "conductor" to -- conductive --.

Signed and Sealed this

Twenty-fourth Day of August, 2004

JON W. DUDAS
*Director of the United States Patent and Trademark Office*